(12) United States Patent
Waller et al.

(10) Patent No.: US 6,250,738 B1
(45) Date of Patent: Jun. 26, 2001

(54) INKJET PRINTING APPARATUS WITH INK MANIFOLD

(75) Inventors: David J Waller; Timothy E Beerling; Melissa D Boyd; James W Pearson; Marvin G Wong, all of Corvallis, OR (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/216,601

(22) Filed: Dec. 17, 1998

Related U.S. Application Data

(63) Continuation-in-part of application No. 08/959,376, filed on Oct. 28, 1997, now Pat. No. 6,123,410, and a continuation-in-part of application No. 09/216,606, filed on Dec. 17, 1998.

(51) Int. Cl.⁷ .................................................. B41J 2/155
(52) U.S. Cl. ............................................... 347/42; 347/13
(58) Field of Search .................................... 347/7, 13, 15, 347/40, 42, 43, 44

(56) References Cited

U.S. PATENT DOCUMENTS

| | | | |
|---|---|---|---|
| 4,578,687 | * 3/1986 | Cloutier et al. | 347/44 |
| 4,620,198 | * 10/1986 | Behun | 347/43 |
| 4,917,286 | 4/1990 | Pollacek | 228/110 |
| 5,016,023 | 5/1991 | Chan et al. | 347/42 |
| 5,124,717 | * 6/1992 | Campanelli et al. | 347/93 |
| 5,160,945 | * 11/1992 | Drake | 347/42 |
| 5,473,350 | * 12/1995 | Mader et al. | 347/7 |
| 5,500,661 | * 3/1996 | Matsubara et al. | 347/40 |

OTHER PUBLICATIONS

Imler, Scholz, Cobarruviaz, Nagesh, Chao, Haitz, "Precision Flip–Chip Solder Bump Interconnects for Optical Packaging", IEEE Transactions on Components, Hybrids, and Manfacturing Tech., vol. 15, #6, Dec. 1992, pp. 997–982.

Itoh, Sasaki, Uda, Yoneda, Honmou, Fukushima, "Use of AuSn Solder Bumps in Three–dimensional Passive Aligned Packaging of LD/PD Arrays on Si Optical Benches", IEEE Electronic Components and Technology Conference, 1996, pp. 1–7.

Deshmukh, Brady, Roll, King, Shmulovic, Zolnowski, "Active Atmosphere Solder Self–Alignment and Bonding of Optical Components", The International Journal of Microcircuits and Electronic Packaging, vol. 16, #2, second quarter 1993, pp. 97–107.

Ludwig, "Multilayered focal plane structures with self–aligning detector assembly", Infrared Readout Electronics III, SPIE, vol. 2745, 1996, pp. 149–158.

Kallmayer, Oppermann, Kloeser, Zakel, Reichl, Experimental Results on the Self–Alignment Process Using Au/Sn Metallurgy and on the Growth of the C–Phase During the Reflow, '95 Flip Chip, BGA, TAB & AP Symposium, 1995, pp. 225–237.

Linder, Baltes, Gnaedinger, Doering, "Photolithography in Anisotropically Etched Grooves", IEEE 9th Intl. Workshop on MEMS, 1996, pp. 38–43.

* cited by examiner

Primary Examiner—N. Le
Assistant Examiner—Lamson D. Nguyen

(57) ABSTRACT

An inkjet printing system includes a scalable printhead with an ink manifold. The scalable printhead is formed by mounting an ink manifold and multiple thermal inkjet printhead dies to a carrier substrate. The carrier substrate is machined to include through-slots. There is a through-slot for each refill slot among the multiple printhead dies. A first end of a given through-slot connects to a refill slot of a corresponding printhead die. An opposite, second end of the through-slot connects to the ink manifold. The ink manifold includes an inlet for coupling to an ink supply reservoir. The ink manifold also includes one or more channels and a plurality of feed openings. Each feed opening connects to a printhead die refill slot by way of a substrate through-slot.

28 Claims, 6 Drawing Sheets

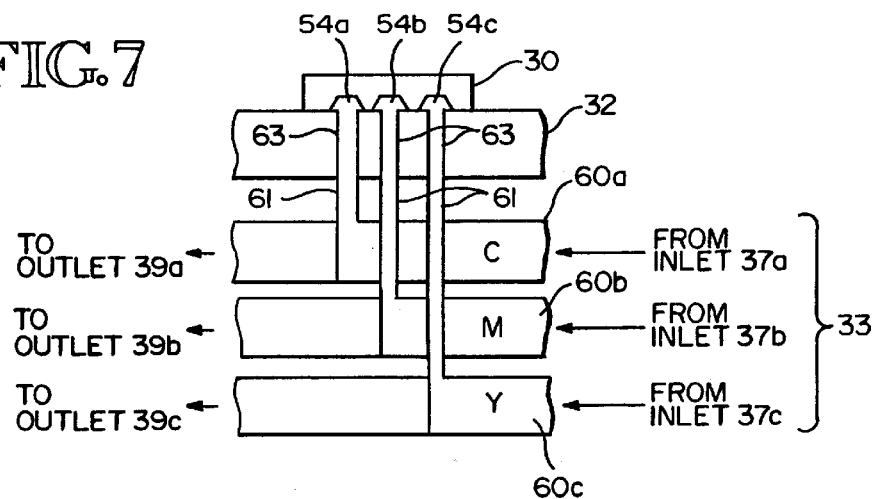
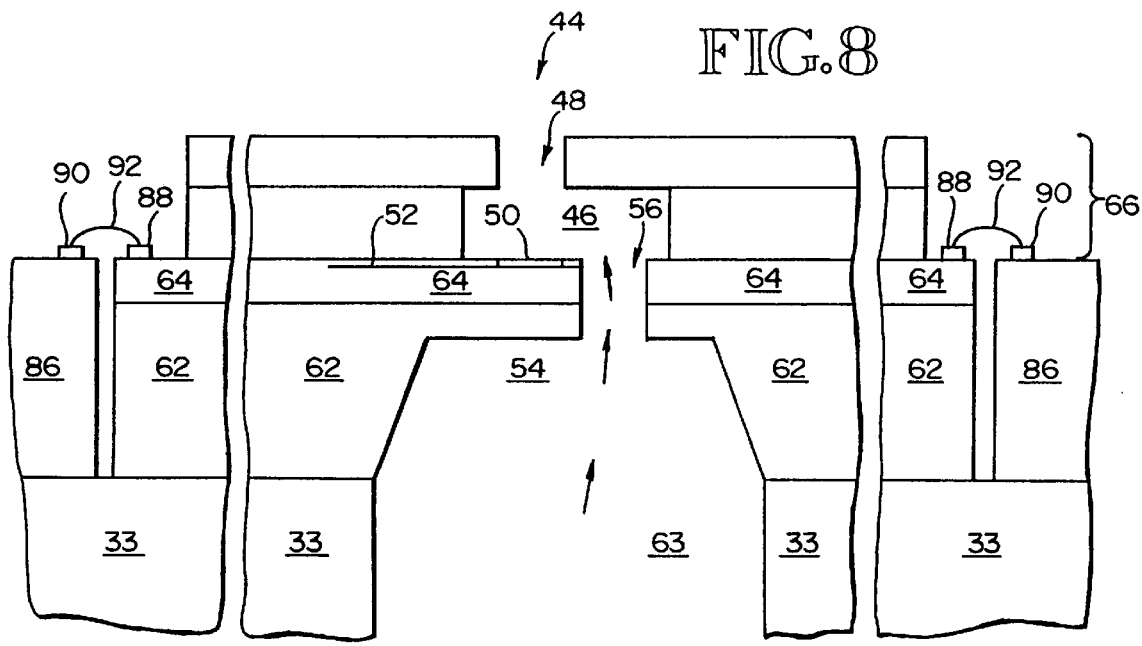

INKJET PRINTING APPARATUS WITH INK MANIFOLD

CROSS REFERENCE TO RELATED APPLICATION

This is a continuation in part of commonly-assigned U.S. patent application Ser. No. 08/959,376, "Scalable Wide-Array Inkjet Printhead and Method for Fabricating Same," filed on behalf of Timothy E. Beerling et al. on Oct. 28, 1997 now U.S. Pat. No. 6,123,410. This also is a continuation in part of commonly-assigned U.S. patent application Ser. No. 09/216,606 entitled 'Multilayered Ceramic Substrate Serving As Ink Manifold and Electrical Interconnection Platform for Multiple Printhead Dies,' filed on behalf of Melissa Boyd et al. on Dec. 17, 1998.

BACKGROUND OF THE INVENTION

This invention relates generally to inkjet printhead construction, and more particularly, to a wide-array inkjet printhead construction.

There are known and available commercial printing devices such as computer printers, graphics plotters and facsimile machines which employ inkjet technology, such as an inkjet pen. An inkjet pen typically includes an ink reservoir and an array of inkjet printing elements, referred to as nozzles. The array of printing elements is formed on a printhead. Each printing element includes a nozzle chamber, a firing resistor and a nozzle opening. Ink is stored in the ink reservoir and passively loaded into respective firing chambers of the printhead via an ink refill channel and ink feed channels. Capillary action moves the ink from the reservoir through the refill channel and ink feed channels into the respective firing chambers. Conventionally, the printing elements are formed on a common substrate.

For a given printing element to eject ink a drive signal is output to such element's firing resistor. Printer control circuitry generates control signals which in turn generate drive signals for respective firing resistors. An activated firing resistor heats the surrounding ink within the nozzle chamber causing an expanding vapor bubble to form. The bubble forces ink from the nozzle chamber out the nozzle opening.

A nozzle plate adjacent to the barrier layer defines the nozzle openings. The geometry of the nozzle chamber, ink feed channel and nozzle opening defines how quickly a corresponding nozzle chamber is refilled after firing. To achieve high quality printing ink drops or dots are accurately placed at desired locations at designed resolutions. It is known to print at resolutions of 300 dots per inch and 600 dots per inch. Higher resolution also are being sought.

There are scanning-type inkjet pens and non-scanning type inkjet pens. A scanning-type inkjet pen includes a printhead having approximately 100–200 printing elements. A non-scanning type inkjet pen includes a wide-array or page-wide-array printhead. A page-wide-array printhead includes more than 5,000 nozzles extending across a page-width. Such nozzles are controlled to print one or more lines at a time.

In fabricating wide-array printheads the size of the printhead and the number of nozzles introduce more opportunity for error. Specifically, as the number of nozzles on a substrate increases it becomes more difficult to obtain a desired processing yield during fabrication. Further, it is more difficult to obtain properly sized substrates of the desired material properties as the desired size of the substrate increases.

In the related matters, cross-referenced above, a scalable wide-array printhead structure is described in which multiple inkjet printhead dies are mounted to a carrier substrate. One of the challenges in forming a wide array printhead with multiple printhead dies is the number of interconnections which occur. Many electrical interconnections are needed. In addition, many ink connections are required to deliver the inks. In a three-color, four inch, wide-array printhead having 34 printhead dies, for example, there are at least 102 fluid interconnections (i.e., 3×34=102). This invention is directed toward an inkjet printing device having an ink manifold.

SUMMARY OF THE INVENTION

According to the invention, an inkjet printing system includes a scalable printhead with an ink manifold. The scalable printhead is formed by mounting an ink manifold and multiple thermal inkjet printhead dies to a carrier substrate. Each printhead die includes a plurality of printing elements. Each printing element includes a nozzle chamber, a firing resistor and a nozzle opening. The nozzle openings are located along one surface of each die. One or more refill slots are located along an opposite surface of each printhead die. The refill slot is fluidly connected to each nozzle chamber allowing ink to flow into the die through the refill slot(s), then into the nozzle chambers. By prescribing a different number of printhead dies to a carrier substrate for different embodiments, different sized printhead embodiments are achieved.

According to one aspect of the invention, the ink manifold is coupled to the carrier substrate. The carrier substrate is machined to include through-openings. There is a through-opening for each refill slot among the multiple printhead dies. A first end of a given through-opening connects to a refill slot of a corresponding printhead die. An opposite, second end of the through-opening connects to the ink manifold. Thus, the ink manifold is coupled to the carrier substrate at the respective second ends of the through-openings.

According to another aspect of this invention, the ink manifold includes an inlet for coupling to an ink supply reservoir. In some embodiments the ink manifold includes a plurality of inlets for coupling to a plurality of ink supply reservoirs, (e.g., reservoirs of different color ink, such as black, cyan, magenta and yellow ink reservoirs). In still other embodiments, there also is an outlet for each inlet. Ink flows into the manifold through an inlet, travels through channels within the manifold, then is cycled out through the corresponding outlet. Some of the ink, however, exits the manifold through fill openings adjacent the carrier substrate through-openings so that ink may travel to the printing element nozzle chambers. Ink leaves the manifold outlet and fill openings.

In varying embodiments the carrier substrate is formed of silicon or a multilayer ceramic. The carrier substrate includes the through-openings, and also includes electrical interconnection pathways for routing signals among the plurality of printhead dies. In the multilayer ceramic substrate embodiment, the carrier substrate includes multiple electrical interconnection planes for routing the electrical signals.

According to another aspect of the invention, the inkjet printing system includes multiple ink reservoirs, one for each color of ink. Separate inlets, manifold channels, outlets, and fill openings are formed in the ink manifold to flow ink from a respective reservoir through the manifold to the carrier substrate and printhead dies. A first fluid path occurs from a first inlet of the manifold through a first set of the fill openings through corresponding carrier substrate through-openings to corresponding printhead die ink refill slots. A second fluid path occurs from a second inlet of the manifold through a second set of the fill openings through corresponding carrier substrate through-openings to corresponding printhead die ink refill slots.

The inkjet printing system also includes a housing, a mounting assembly, a media transport assembly, and a controller. The inkjet printhead is positioned at the mounting assembly and includes a plurality of printing elements. A print zone occurs adjacent to the plurality of printing elements along a media path. The media transport assembly moves a media sheet along the media path into the print zone. The controller determines a timing pattern for ejecting ink from the plurality of printing elements onto the media sheet.

According to another aspect of the invention, one method for loading the plurality of inkjet nozzles includes replacing the internal reservoir of the pen, and flowing ink from the internal reservoir into the ink manifold. The manifold has an inlet coupled to the internal reservoir. The ink manifold fluidly connects the inlet to a plurality of through-openings of the carrier substrate, which in turn are coupled to respective ink refill slots of a plurality of printhead dies. Ink flows into the respective ink refill slots, then into a plurality of nozzle chambers. Ink is fired from the nozzle chambers to print onto a media sheet.

One advantage of the invention is that a manifold formed separate from the carrier substrate and mounted to the carried substrate is that new printhead designs may be more rapidly prototyped and tested. In addition, for a multilayer ceramic carrier substrate, because layers for ink communication are not needed, fewer substrate layers may be used, thereby reducing the complexity of the carrier substrate and reducing the cost of fabricating the carrier substrate. Some of such cost reduction is offset by the fabrication of the manifold. However, for a precision molded or machined manifold, significant savings accrue. Another advantage includes a more rigid printhead assembly and added stability to the carrier substrate by excluding large internal cavities. Another possible advantage is relaxed ink corrosion requirements of the substrate material. These and other aspects and advantages of the invention will be better understood by reference to the following detailed description taken in conjunction with the accompanying drawings.

BRIEF DESCRIPTION OF THE DRAWINGS

FIG. 7 is a diagram of a printhead die, partial carrier substrate and partial manifold illustrating ink receipt from three ink sources; and FIG. 8 is a cross-sectional view of a portion of the printhead assembly according to another embodiment of the invention.

DESCRIPTION OF SPECIFIC EMBODIMENTS

Printing System

Figure 1:
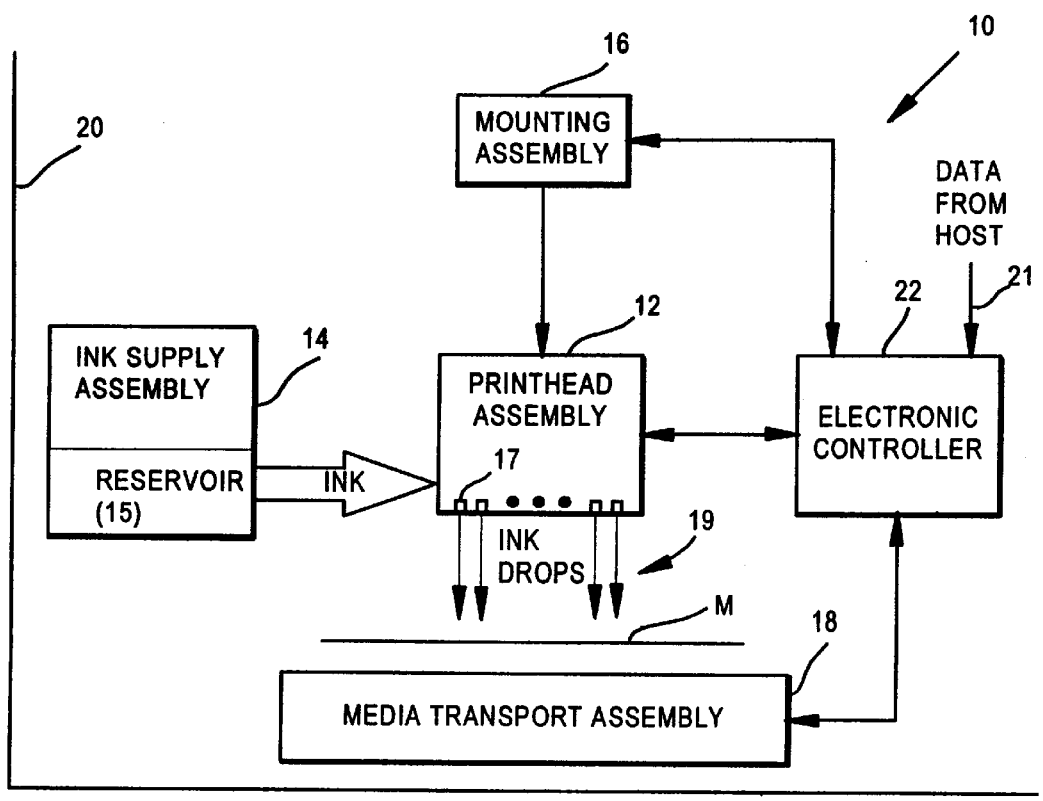
FIG. 1 is a block diagram of an inkjet printing system according to an embodiment of this invention.

Referring to FIG. 1, a thermal inkjet printing system 10 includes an inkjet printhead assembly 12, an ink supply assembly 14, a mounting assembly 16, a media transport assembly 18, a housing 20 and an electronic controller 22. The inkjet printhead assembly 12 is formed according to an embodiment of this invention, and includes one or more printheads having a plurality of inkjet nozzles 17 which eject ink onto a media sheet M. The printhead assembly 12 receives ink from the ink supply assembly 14. The ink supply assembly 14 includes a reservoir 15 for storing the ink. Ink is supplied to the printhead assembly 12 in either a recirculating or a closed end delivery system. In some embodiments the ink supply assembly 14 and inkjet printhead assembly 12 are housed together in an inkjet pen or cartridge. In other embodiments the ink supply assembly 14 is separate from the inkjet printhead assembly 12 and feeds ink to the printhead assembly through an interface connection, such as a supply tube. For either approach the ink supply may be removed, replaced and/or refilled. For example, in an inkjet pen having an internal reservoir, the pen may be disassembled and the internal reservoir removed. A new, filled reservoir then is placed within the pen, and the pen reassembled for re-use. Alternatively, the prior reservoir may be refilled and reinstalled in the pen or filled in place without removal from the pen (and in some embodiments without even disassembling the pen). In some embodiments there is a local reservoir within the pen along with a larger reservoir located separate from the pen. The separate reservoir serves to refill the local reservoir. In various embodiments, the separate reservoir and/or the local reservoir may be removed, replaced and/or refilled.

The inkjet printhead assembly 12 is mounted relative to the housing 20 to define a print zone 19 adjacent to the printhead nozzles 17 in an area which is to receive the media sheet M. The media sheet M is moved into the print zone 19 by the media transport assembly 18. The mounting assembly 16 positions the printhead assembly 12 relative to the media transport assembly 18. For a scanning type inkjet printhead assembly, the mounting assembly 16 includes a carriage for moving the printhead assembly 12 relative to a media transport path to scan the printhead assembly 12 relative to the media sheet. For an indexing type inkjet printhead assembly, the mounting assembly 16 includes a mechanism for indexing movement of the printhead assembly 12 relative to the media transport path. For a non-moving inkjet printhead assembly, the mounting assembly 16 fixes the inkjet printhead assembly 12 at a prescribed position along the media transport path.

The electronic controller 22 receives documents, files or other data 21 to be printed from a host system, such as a computer. Typically, a print job is sent to the inkjet printing system 10 along an electronic, infrared, optical or other information transfer path. The print job includes data and one or more commands or command parameters. The electronic controller 22 includes memory for temporarily storing the data. The electronic controller 22 provides timing control for firing respective inkjet nozzles 17 to define a pattern of ejected ink drops which form characters, symbols or other graphics on the media sheet M. The pattern is determined by the print job data and print job commands or command parameters.

Upon activation of a given firing resistor 50, ink within the surrounding nozzle chamber 46 is ejected through the nozzle opening 48 onto a media sheet M. The electronic controller 22 selects which firing resistors 50 are active at a given time by activating corresponding drive signals to heat the corresponding firing resistors 50. In one embodiment logic circuits and drive circuits forming a portion of the controller 22 are mounted to the substrate 32 of the printhead assembly 12. In an alternative embodiment logic circuitry and drive circuitry are located off the printhead assembly 12.

Figure 2:
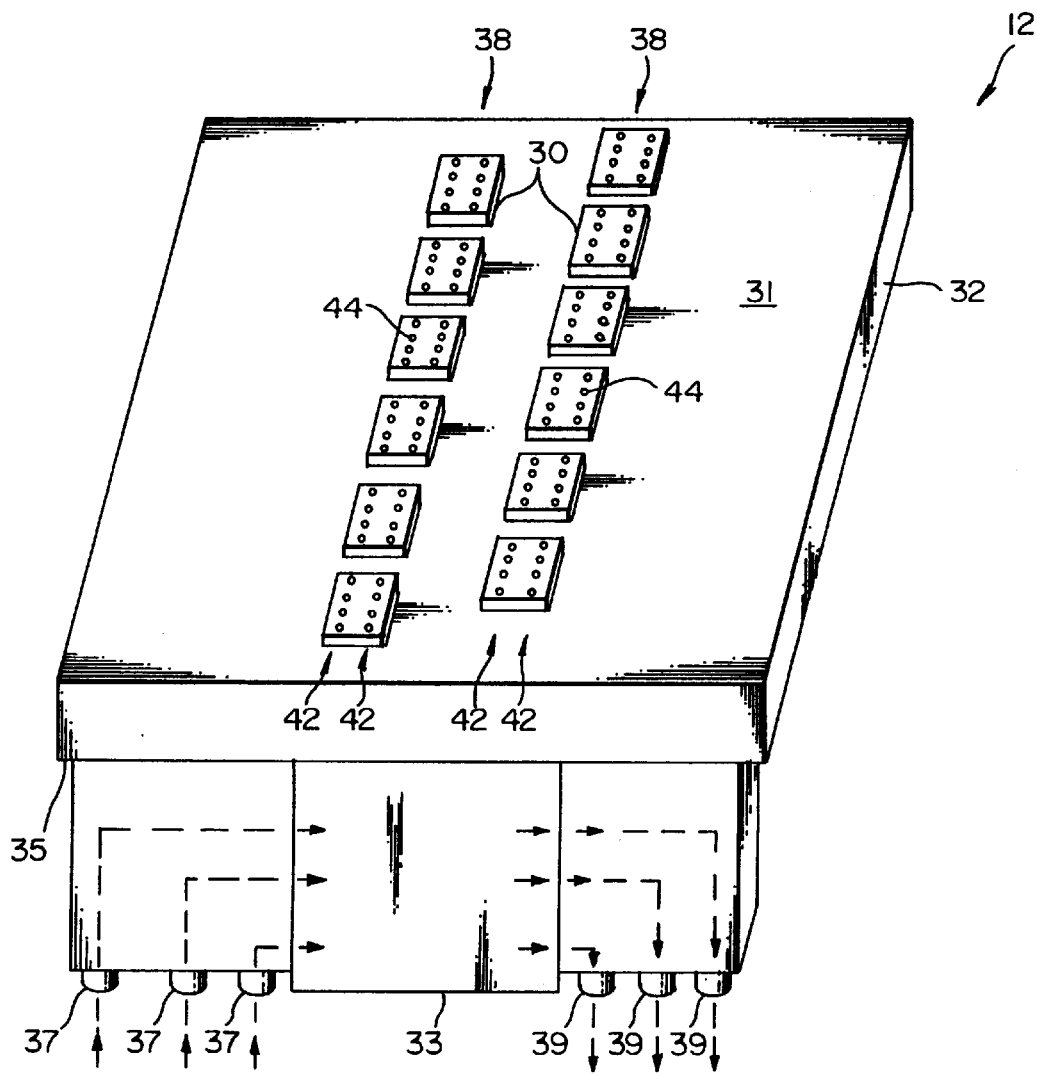
FIG. 2 is a perspective view of the printhead assembly of FIG. 1 according to an embodiment of this invention.

Referring to FIG. 2, according to a preferred embodiment the printhead assembly 12 includes a plurality of inkjet printhead dies 30 mounted to a first face 31 of a carrier substrate 32. An ink manifold 33 is mounted to a second face 35 of the carrier substrate 32. Illustrated is a wide array inkjet printhead assembly.

The ink manifold 33 includes one or more inlets 37 and one or more corresponding outlets 39 coupled to corresponding ink reservoirs 15. In one embodiment each pair of one inlet 37 and one outlet 39 is coupled to a corresponding reservoir 15. The manifold 33 includes a channel for flowing ink received from a given reservoir 15 at one inlet 37 through the channel to the outlet 39 and back to the reservoir. Ink also flows from the manifold 33 through the carrier substrate 32 and into refill slots of the printhead dies 30. In alternative embodiments, the manifold 33 does not include outlets 39 for cycling ink back to the reservoir. In such case, ink flows into the manifold 33 from the ink reservoir 15 and exits through the carrier substrate 32 to the printhead dies' refill slots.

The one or more reservoirs 15 are part of the ink supply assembly 14. The printhead assembly 12 may span a nominal page width or a shorter or longer width, and may be of the scanning type, indexing type or non-moving type. In various embodiments, as described above, the reservoirs are replaceable or refillable reservoirs. In one embodiment the reservoirs are coupled to corresponding external reservoirs which supply the local reservoirs. In another embodiment the reservoirs are non-refillable.

Printhead Dies

Referring to FIG. 2, the printhead dies 30 are aligned in one or more rows 38 on a first surface 31 of the carrier substrate 32. In the embodiment illustrated dies are spaced apart and the rows are staggered so that the spacings are offset. Each one of the printhead dies 30 includes a plurality of rows 42 of inkjet printing elements 44, also referred to as nozzles. Preferably, the respective rows of printing elements 44 also are aligned.

Figure 3:
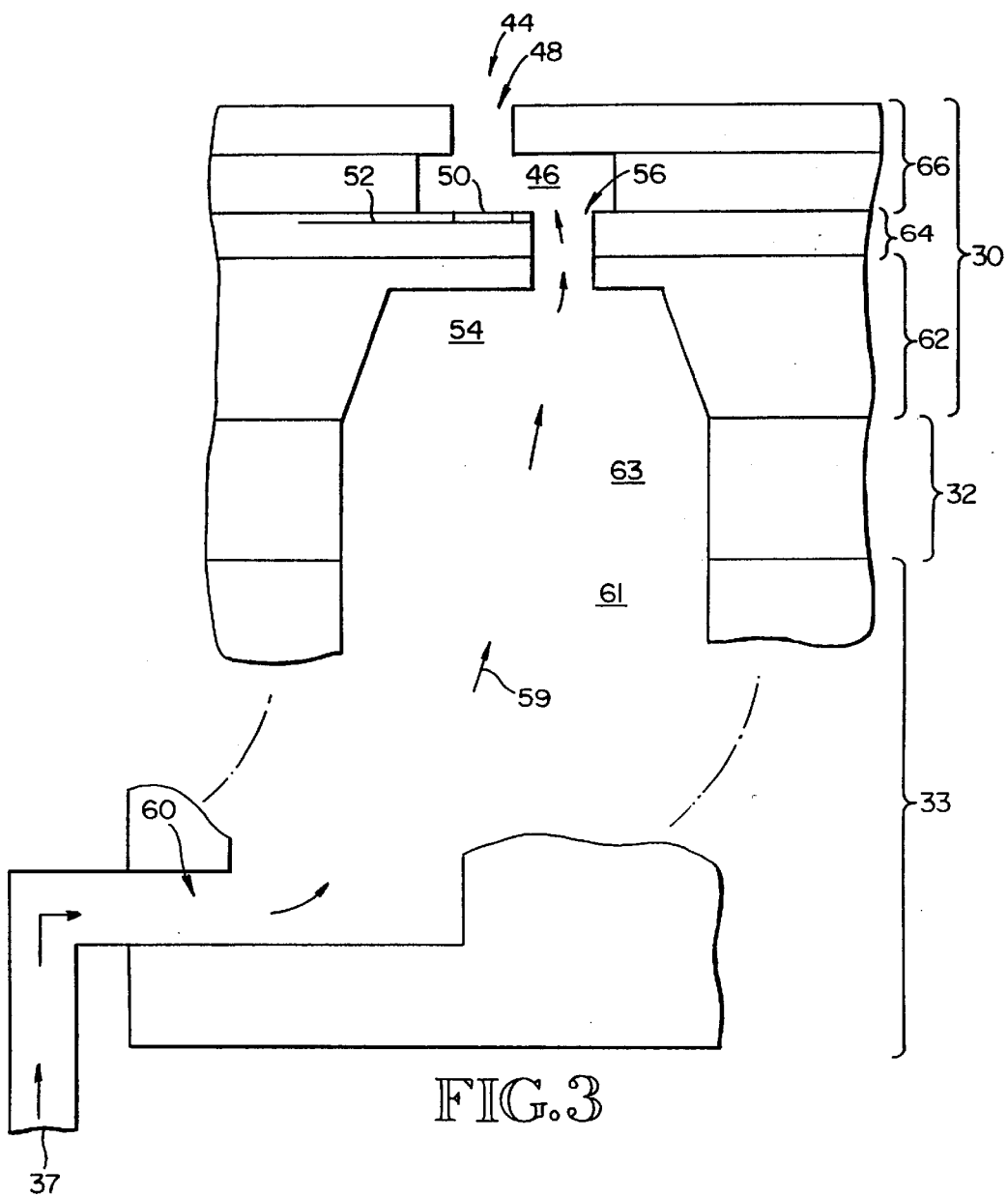
FIG. 3 is a diagram of ink flow through the ink manifold of FIG. 2 to a given printing element of a given printhead die.

Each printhead die 30 includes an array of printing elements 44. Referring to FIG. 3, each printing element 44 includes a nozzle chamber 46 having a nozzle opening 48. A firing resistor 50 is located within the nozzle chamber 46. Wiring lines 52 electrically couple the firing resistor 50 to a drive signal and ground. Each printhead die 30 also includes a refill channel 54. Ink flows from the internal reservoir 15 into inlet 37 of the ink manifold 33 along path 59, through a manifold channel 60, out a manifold 33 feed opening 61, through the corresponding through-opening 63 of the carrier substrate 32, and into the refill channels 54 of the printhead dies 30. Ink flows through each printhead refill channel 54 into the a plurality of printhead nozzle chambers 46 via respective ink feed channels 56.

In one embodiment one or more of the printhead dies 30 is a fully integrated thermal inkjet printhead formed by a silicon die 62, a thin film structure 64 and an orifice layer 66. Glass or a stable polymer are used in place of the silicon in alternative embodiments. The thin film structure 64 is formed by one or more passivation or insulation layers of silicon dioxide, silicon carbide, silicon nitride, tantalum, poly silicon glass; or another suitable material. The thin film structure also includes a conductive layer for defining the firing resistor 50 and the wiring lines 52. The conductive layer is formed by aluminum, gold, tantalum, tantalum-aluminum or other metal or metal alloy.

Detailed descriptions of the method for mounting and interconnecting the printhead dies 30 to the substrate 32 are described in the related application of Beerling et al. (Ser. No. 08/959,376, "Scalable Wide-Array Inkjet Printhead and Method for Fabricating Same," filed on Oct. 28, 1997), cross-referenced above and included herein by reference.

Carrier Substrate

In varying embodiments, the carrier substrate 32 is made of silicon or a multilayered ceramic material. The carrier substrate 32 serves to carry the plurality of printhead dies 30, provide electrical interconnection among the printhead dies 30, and provide electrical interconnection between the printhead dies 30 and the electronic controller 22 (see FIG. 1). One of the advantages of the carrier substrate is that a thin film layer of metal or metal pads (e.g., gold) are accurately sized and placed on the substrate. Such metalization allows for precise positioning and alignment of the printhead dies 30.

The carrier substrate includes through-channels or through-openings 63 for passing ink from the ink manifold 33 to the printhead dies 30. For the multilayer ceramic embodiment the substrate 32 is formed of similar material as used in forming hybrid multichip modules, although other materials may be used.

Figure 4:
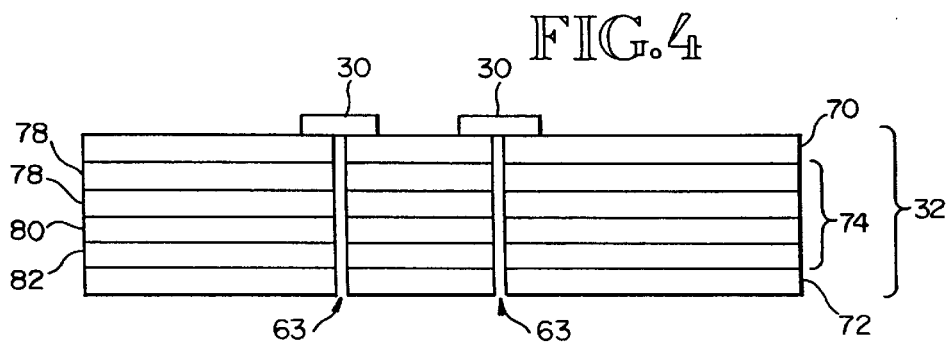
FIG. 4 is a diagram of the carrier substrate of FIG. 2 with mounted printhead dies.

The ceramic substrate preferably has a coefficient of thermal expansion matching that of silicon, is able to receive solder and interconnect layers, and is able to receive mounting of integrated circuits. Referring to FIG. 4, the substrate 32 includes a top layer 70 upon which the printhead dies 30 are mounted, a bottom layer 72 and several intermediary layers 74. The intermediary layers provide electrical interconnection and include one or more signal distribution layers 78, a power plane layer 80, and a ground plane layer 82.

Each of the ceramic layers 70–74 has a thickness ranging from 5–25 mils. The signal distribution layers 78 include circuit patterns. Conductive vias pierce the layers 78, 80, 82 forming electrical interconnects between circuits. In one fabrication methodology, circuit patterns are formed in layers of unfired tape (referred to as a green sheet) using a screen printing process. The green sheet is made of ceramic particles in a polymer binder. Alumina, although not having the same coefficient of thermal expansion as silicon, may be used for the particles, although other oxides, nitrides, carbides, or other ceramics various glass/ceramic blends also may also be used.

Each green sheet layer receives conductor lines and other metallization patterns as needed to define the signal distribution planes 78, the power plane 80, and the ground plane 82. Such lines and patterns are formed with a refractory metal, such as tungsten, by screen printing on the corresponding green sheet layer. Electrical interconnects are made from one layer to the next through via holes punched out from the green sheet and filled in with tungsten.

The through openings 63 within the substrate 32 are formed by punching holes and cavities of desired size and shape through the alumina tape. Although only one through-opening 63 is shown for a given printhead die 30, there may be additional through-openings to the same printhead die to provide ink of respective differing colors. Once each layer has received the desired metallization, vias and openings, the layers are stacked in the desired configuration and laminated under pressure. The substrate then is shaped to a desired outer dimension size allotting for shrinkage during a subsequent processing. Next, the ceramic and metallization materials are cosintered at approximately 1600° C., creating a monolithic carrier substrate structure having a three dimensional wiring system. Metal parts such as I/O pins and seal rings are attached with a molten brazing process, such as a silver-copper eutectic brazing or a pure silver brazing. Exposed metal and metallization surfaces then are covered in a plating process, such as a nickel plating process and a finish plating, such as a gold plating with nickel undercoating. The finish plating serves to hermetically seal the ceramic substrate. The top layer 70 typically is metallized in preparation for surface mounting the printhead dies 30. The bottom layer 72 is adapted to receive drive and control circuits and connectors 75 (see FIG. 5).

Ink Manifold

Figure 5:
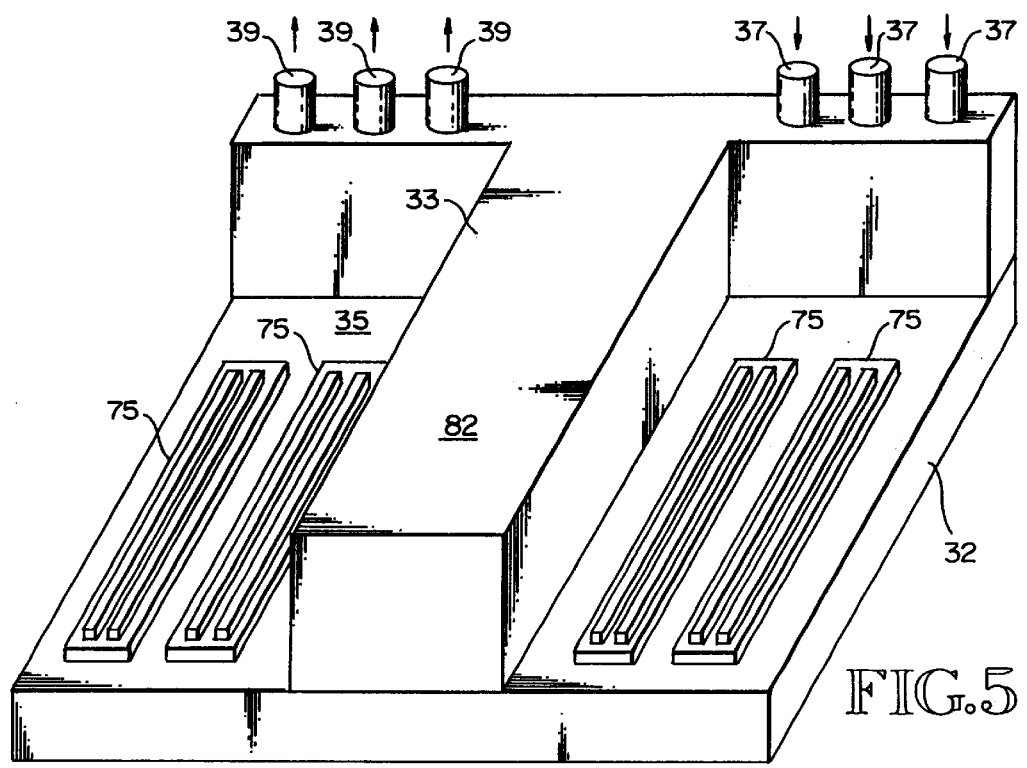
FIG. 5 is another perspective view of the printhead assembly of FIG. 2.

Referring to FIG. 5, the ink manifold 33 includes a housing 82, one or more inlets 37 and one or more outlets 39. Each one or more pairs of an inlet 37 and an outlet 39 are coupled to a corresponding reservoir. For example, one pair of an inlet 37 and an outlet 39 is coupled to a reservoir of cyan ink. Another pair of an inlet 37 and an outlet 39 is coupled to a reservoir of magenta ink. Yet another pair of an inlet 37 and an outlet 39 is coupled to a reservoir of yellow ink. The number of pairs 37/39, reservoirs 15 and colors of ink may vary. Illustrated is a manifold for a printhead assembly supporting three colors of ink. In some embodiments a fourth color ink (e.g., black) also is supported by including additional pathways and an inlet/outlet pair.

Figure 6A:
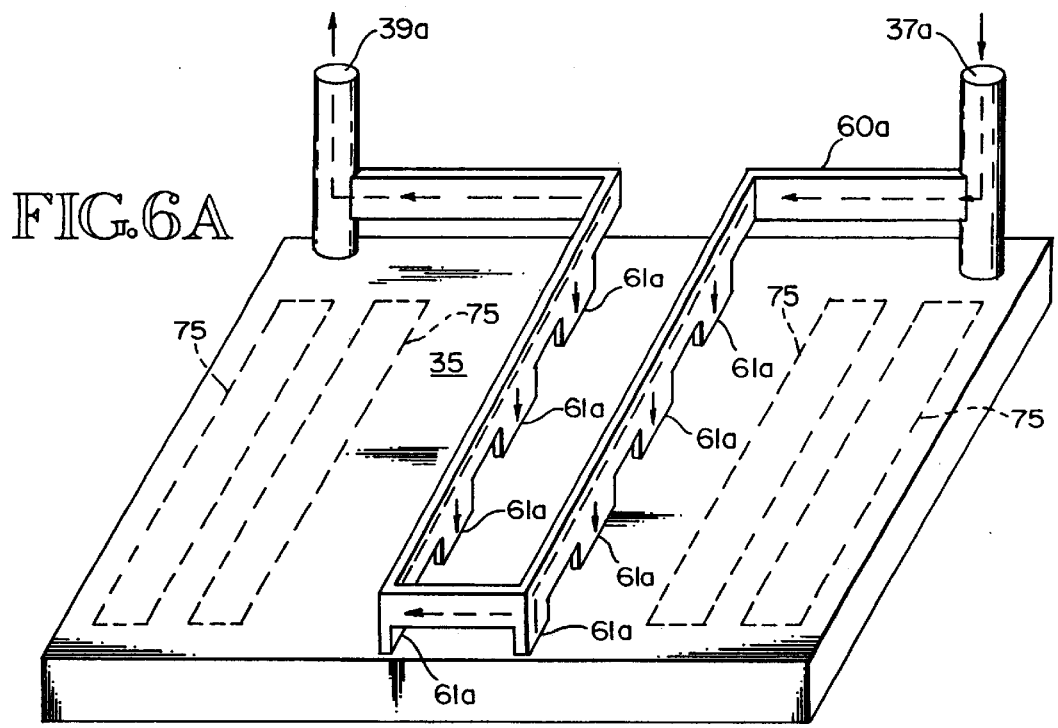
FIGS. 6A–C are diagrams of respective ink flow pathways for ink from respective ink reservoirs.
Figure 6B:
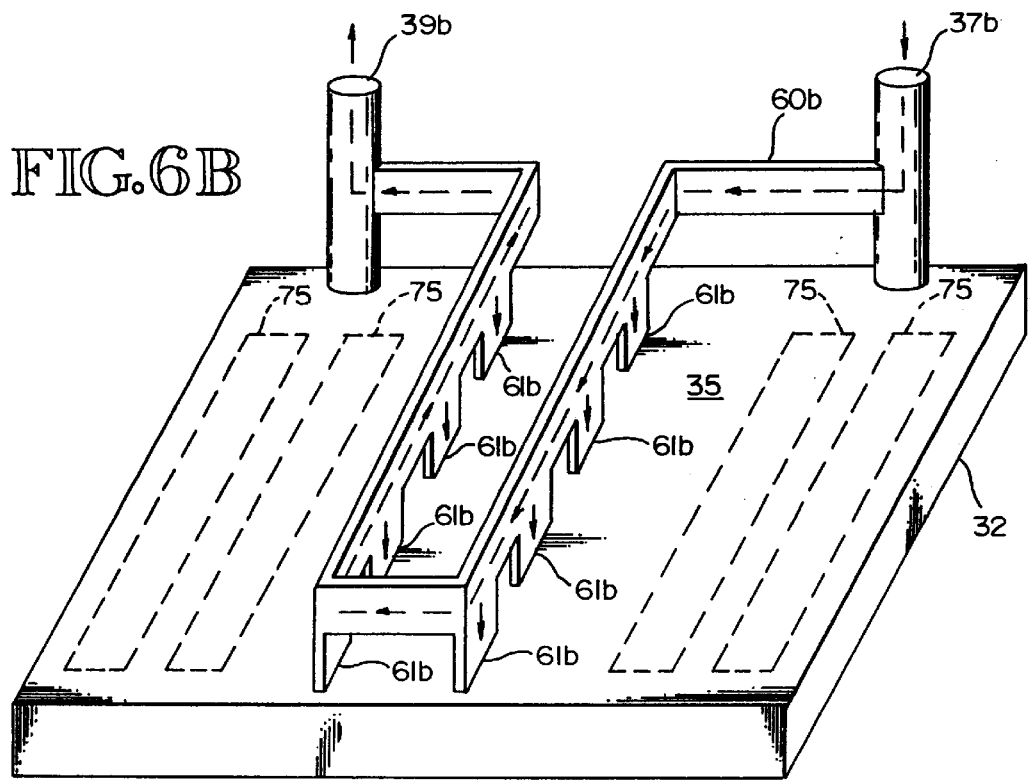
Figure 6C:
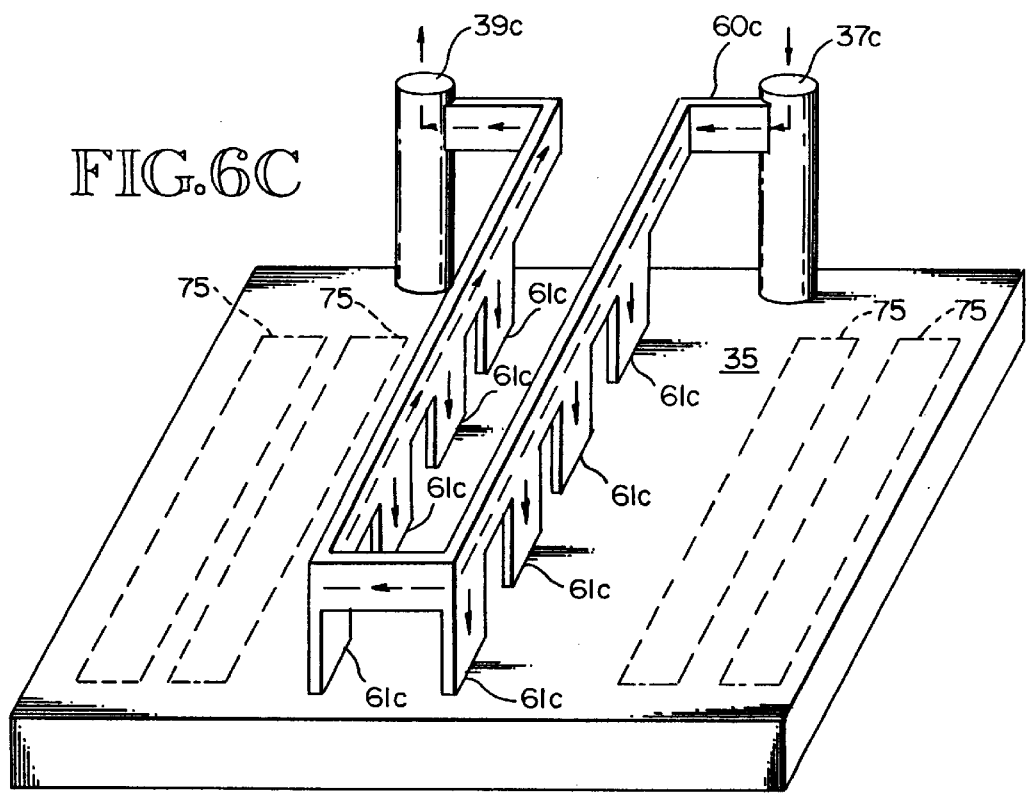

FIGS. 6A–C show respective pathways through the ink manifold 33 for corresponding inlet/outlet pairs. Note that the housing is removed and that the other pathways and inlet/outlet pairs are omitted for illustrative clarity. FIG. 6A shows the pathway for one inlet/outlet pair 37a/39a. FIG. 6B shows the pathway for one inlet/outlet pair 37b/39b. FIG. 6C shows the pathway for one inlet/outlet pair 37c/39c. Referring to FIG. 6A, ink is received at inlet 37a, then travels through a channel 60a. The channel 60a extends from the inlet 37a to the outlet 39a. Along the channel 60a are a plurality of fill openings 61a. Each fill opening 61a fluidly couples to a corresponding through-opening 63 (see FIGS. 3 and 7) in the carrier substrate 32. In one embodiment there is a fill opening 61a for each printhead die 30 which is to print ink from the source reservoir feeding the inlet 37a. Ink is cycled through the channel 60a from inlet 37a to outlet 39a. Along the way, some ink flows out the manifold 33 through the carrier substrate 32 to the printhead dies 30.

Similarly, referring to FIG. 6B, ink is received at inlet 37b, then travels through a channel 60b. The channel 60b extends from the inlet 37b to the outlet 39b. Along the channel 60b are a plurality of fill openings 61b. Each fill opening 61b fluidly couples to a corresponding through-opening 63 (see FIGS. 3 and 7) in the carrier substrate 32. In one embodiment there is a fill opening 61b for each printhead die 30 which is to print ink from the source reservoir feeding the inlet 37b. Ink is cycled through the channel 60b from inlet 37b to outlet 39b. Along the way, some ink flows out the manifold 33 through the carrier substrate 32 to the printhead dies 30.

Referring to FIG. 6C, ink is received at inlet 37c, then travels through a channel 60c. The channel 60c extends from the inlet 37c to the outlet 39c. Along the channel 60c are a plurality of fill openings 61c. Each fill opening 61b fluidly couples to a corresponding through-opening 63 (see FIGS. 3 and 7) in the carrier substrate 32. In one embodiment there is a fill opening 61c for each printhead die 30 which is to print ink from the source reservoir feeding the inlet 37c. Ink is cycled through the channel 60c from inlet 37c to outlet 39c. Along the way, some ink flows out the manifold 33 through the carrier substrate 32 to the printhead dies 30.

In an embodiment each printhead die 30 includes respective sets of nozzles for printing ink of a corresponding color. Such printhead dies include three ink refill slots 54a–c, one for receiving ink from each of the respective manifold channels 60a–c. In an exemplary embodiment, the three channels 60a–c carry ink of respective colors (e.g., cyan, magenta, and yellow). FIG. 7 shows a given printhead die 30 with the three ink refill slots 54a–c receiving ink through the carrier substrate 32 from the ink manifold channels 60a–c.

The ink manifold channels 60a–c are formed by a molding process in one embodiment and attached to the carrier substrate 32 using an ink-resistant epoxy or other adhesive. In another embodiment the channels 60a–c are machined to the desired shape and assembled, then attached to the carrier substrate 32 using an ink-resistant epoxy or adhesive. In still another embodiment the channels 60a–c are assembled and compressed using gaskets. The manifold 33, including the channels 60 are formed from plastic, metal, ceramic or another suitable material. Although, the embodiment of FIG. 5 only shows the inlets 37 and outlets 39 extending from the housing 33, in other embodiments other portions may extend outside the housing. For example, in some embodiments a tube or other external communication channel connects a portion of channel 60 serving one row to another portion of channel 60 serving another row. Fluid interconnects are achieved as described in the related application of Beerling et al. (Ser. No. 08/959,376, "Scalable Wide-Array Inkjet Printhead and Method for Fabricating Same," filed on Oct. 28, 1997), cross-referenced above and included herein by reference.

Alternative Embodiment

Referring to FIG. 8, in an alternative embodiment the printhead dies 30 are carried by the manifold 33, rather than the substrate 32. An electrical signal carrier 86 embodies the substrate 32 or electrically connects the dies 30 the substrate 32. In the embodiment illustrated, the signal carrier 86 is in the form of a mask which is mounted to the manifold 33 on the same side of the manifold 33 as the printhead dies 30. There are openings in the signal carrier 86 which allow the printhead dies 30 to be mounted in contact with the manifold 33. In one embodiment the dies 30 are electrically coupled to the signal carrier 86 by interconnection tabs 88, 90 and a wire bond 92, although other electrical bonding, wire bonding or TAB interconnection processes may be used.

Meritorious and Advantageous Effects

One advantage of the invention is that a manifold formed separate from the carrier substrate and mounted to the carrier substrate is that new printhead designs may be more rapidly prototyped and tested. In addition, for a multilayer ceramic carrier substrate fewer layers are needed thereby reducing the complexity of the carrier substrate and reducing the cost of fabricating the carrier substrate. Some of such cost reduction is offset by the fabrication of the manifold. However, for a precision molded or machined manifold, significant savings accrue. Other advantages include added stability to the carrier substrate by excluding large internal cavities and a more rigid printhead assembly.

Although a preferred embodiment of the invention has been illustrated and described, various alternatives, modifications and equivalents may be used. For example, although a wide array printhead is illustrated, a smaller array scanning type, indexing type or non-moving type printhead also may be formed. Therefore, the foregoing description should not be taken as limiting the scope of the inventions which are defined by the appended claims.

What is claimed is:

1. An inkjet pen, comprising:

a pen body housing an ink reservoir;

a manifold frame having an inlet, a first channel and a plurality of exit channels which together form a manifold, ink flowing from the reservoir into the manifold at the inlet, and from the inlet through the first channel to the plurality of exit channels;

a carrier substrate distinct from the manifold frame and having a plurality of through channels, each one through channel coupled to receive ink from a corresponding one of the plurality of manifold exit channels; and a plurality of printhead dies mounted to the carrier substrate, each printhead die comprising an array of printing elements and an ink refill slot, each ink refill slot receiving ink from the reservoir by way of the ink manifold and a corresponding substrate through channel, wherein each one printing element of the array of printing elements comprises a nozzle chamber and a feed channel, the feed channel being coupled to the ink refill slot of the printhead die.

2. The inkjet pen of claim 1, wherein the ink manifold is mounted to the carrier substrate.

3. The inkjet pen of claim 1, wherein the reservoir is a first reservoir and further comprising a second reservoir for storing ink, wherein the inlet is a first inlet and the ink manifold has a second inlet for receiving ink from the second reservoir, wherein the manifold forms separate channels for ink from the first reservoir and ink from the second reservoir, a first channel occurring from the first inlet to a first set of the plurality of openings and a second channel occurring from the second inlet to a second set of the plurality of openings, the first set and second set being mutually exclusive, and wherein a given ink refill slot from any given printhead die is coupled to one of the plurality of openings of the manifold among one of either the first set or second set of openings by way of a corresponding substrate through channel.

4. The inkjet pen of claim 1 in which the ink manifold is formed of molded plastic.

5. The inkjet pen of claim 1 in which the ink manifold is formed of metal machined to shape.

6. The inkjet pen of claim 1 in which the ink manifold comprises a gasket assembly.

7. The inkjet pen of claim 1 in which the ink manifold is ceramic.

8. The inkjet pen of claim 1, in which the carrier substrate is formed by a multilayered ceramic.

9. The inkjet pen of claim 1, in which the carrier substrate is a silicon substrate.

10. An inkjet printing system, comprising:

a housing;

a mounting assembly;

a media transport assembly;

a controller;

an ink reservoir; and an inkjet pen;

wherein the inkjet pen is positioned at the mounting assembly and includes a plurality of printing elements; a print zone occurring adjacent to the plurality of printing elements along a media path; the media transport assembly moving a media sheet along the media path into the print zone; the controller determining a timing pattern for ejecting ink from the plurality of printing elements onto the media sheet; the mounting assembly, media transport assembly, and controller located within the housing;

wherein the inkjet pen comprises:

a manifold frame having an inlet, a first channel and a plurality of exit channels which together form a manifold, ink flowing from the reservoir into the manifold at the inlet, and from the inlet through the first channel to the plurality of exit channels;

a carrier substrate distinct from the manifold frame and having a plurality of through channels, each one through channel coupled to receive ink from a corresponding one of the plurality of manifold exit channels; and a plurality of printhead dies mounted to the carrier substrate, each printhead die comprising an array of printing elements and an ink refill slot, each ink refill slot receiving ink from the reservoir by way of the ink manifold and a corresponding substrate through channel, wherein each one printing element of the array of printing elements comprises a nozzle chamber and a feed channel, the feed channel being coupled to the ink refill slot of the printhead die.

11. The inkjet printing system of claim 10, wherein the ink manifold is mounted to the carrier substrate.

12. The inkjet printing system of claim 10, wherein the reservoir is a first reservoir and further comprising a second reservoir for storing ink, wherein the inlet is a first inlet and the ink manifold has a second inlet for receiving ink from the second reservoir, wherein the manifold forms separate channels for ink from the first reservoir and ink from the second reservoir, a first channel occurring from the first inlet to a first set of the plurality of openings and a second channel occurring from the second inlet to a second set of the plurality of openings, the first set and second set being mutually exclusive, and wherein a given ink refill slot from any given printhead die is coupled to one of the plurality of openings of the manifold among one of either the first set or second set of openings by way of a corresponding substrate through channel.

13. The inkjet printing system of claim 10, in which the ink manifold is formed of molded plastic.

14. The inkjet printing system of claim 10, in which the ink manifold is formed of metal machined to shape.

15. The inkjet printing system of claim 10, in which the ink manifold comprises a gasket assembly.

16. The inkjet printing system of claim 10, in which the ink manifold is ceramic.

17. The inkjet printing system of claim 10, in which the carrier substrate is formed by a multilayered ceramic.

18. The inkjet printing system of claim 10, in which the carrier substrate is a silicon substrate.

19. A method for loading an inkjet pen having an internal reservoir, a manifold, a carrier substrate and a plurality of printhead dies, the manifold formed by an inlet, a first channel and plurality of exit channels, the carrier substrate distinct from the manifold and having a plurality of through channels corresponding to the plurality of exit channels, each printhead die mounted to the carrier substrate, each printhead die having an ink refill slot in communication with a corresponding plurality of inkjet nozzle chambers, the method comprising the steps of:

replacing the reservoir; and flowing ink from the reservoir into the manifold inlet;

flowing ink from the inlet through the first channel and out the plurality of exit channels to the corresponding plurality of through channels; and flowing ink from the plurality of through channels to the plurality of printhead dies at the ink refill slot of each printhead die and into the plurality of nozzle chambers corresponding to the ink refill slot.

20. An inkjet pen, comprising:

a pen body having an ink reservoir;

an ink manifold having an inlet, a first channel and a plurality of exit channels, wherein ink flows from the reservoir into the inlet, then through the first channel to exit the manifold at the plurality of exit channels;

a plurality of printhead dies, each printhead die comprising an array of printing elements and an ink refill slot which receives ink from the reservoir through the ink manifold; and a multilayered substrate having a plurality of electrical interconnection pathways in electrical communication with the plurality of printhead dies, the pathways formed in part within a plurality of intermediary layers of the substrate, wherein one or more printhead control signals couple to the plurality of printhead dies using the plurality of electrical interconnection pathways.

21. The inkjet pen of claim 20, in which each one of the plurality of printhead dies are mounted to the ink manifold.

22. The inkjet pen of claim 20, in which each one of the plurality of printhead dies are mounted to the substrate.

23. An inkjet printing system, comprising:

a housing;

a mounting assembly;

a media transport assembly;

a controller;

an ink reservoir; and an inkjet pen;

wherein the inkjet pen is positioned at the mounting assembly and includes a plurality of printing elements; a print zone occurring adjacent to the plurality of printing elements along a media path; the media transport assembly moving a media sheet along the media path into the print zone; the controller determining a timing pattern for ejecting ink from the plurality of printing elements onto the media sheet; the mounting assembly, media transport assembly, and controller located within the housing;

wherein the inkjet pen comprises:

an ink manifold having an inlet, a first channel and a plurality of exit channels, wherein ink flows from the reservoir into the inlet, then through the first channel to exit the manifold at the plurality of exit channels;

a plurality of printhead dies, each printhead die comprising an array of printing elements and an ink refill slot which receives ink from the reservoir through the ink manifold; and a multilayered substrate having a plurality of electrical interconnection pathways in electrical communication with the plurality of printhead dies, the pathways formed in part within a plurality of intermediary layers of the substrate, wherein one or more printhead control signals couple to the plurality of printhead dies using the plurality of electrical interconnection pathways.

24. The inkjet printing system of claim 23, in which each one of the plurality of printhead dies are mounted to the ink manifold.

25. The inkjet printing system of claim 23, in which each one of the plurality of printhead dies are mounted to the substrate.

26. An inkjet assembly, comprising:

a first reservoir storing ink of a first color;

a second reservoir storing ink of a second color different from the first color; and an inkjet pen comprising a manifold frame, a carrier substrate distinct from the manifold frame and a plurality of printhead dies mounted to the carrier substrate;

the manifold frame forming a first manifold communicating with the first reservoir and a second manifold communicating with the second reservoir, the first and second manifolds not inter-communicating;

the carrier substrate having a plurality of through channels, each one through channel coupled to receive ink from a corresponding one of the first manifold and second manifold;

each one die of the plurality of printhead dies comprising an array of printing elements and an ink refill slot, each one printing element of the array comprising a nozzle chamber and a feed channel, the feed channel coupled to receive ink from the ink refill slot of the corresponding printhead die, each ink refill slot receiving ink from a corresponding substrate through channel.

27. The inkjet assembly of claim 26, wherein the inkjet pen further comprises a pen body, the pen body housing the first reservoir, the second reservoir and the manifold frame.

28. The inkjet assembly of claim 26, wherein the manifold frame is mounted to one side of the carrier substrate and the plurality of printhead dies are mounted to an opposite side of the carrier substrate.

* * * * *